United States Patent
Zhang et al.

(10) Patent No.: US 10,727,892 B2
(45) Date of Patent: Jul. 28, 2020

(54) INTERFACE CIRCUIT

(71) Applicant: NXP USA, Inc., Austin, TX (US)

(72) Inventors: Xu Zhang, Chandler, AZ (US); Ahmad Yazdi, Chandler, AZ (US); Cornelis Johannes Speelman, Eindhoven (NL)

(73) Assignee: NXP USA, Inc., Austin, TX (US)

( * ) Notice: Subject to any disclaimer, the term of this patent is extended or adjusted under 35 U.S.C. 154(b) by 402 days.

(21) Appl. No.: 15/668,611

(22) Filed: Aug. 3, 2017

(65) Prior Publication Data

US 2019/0044564 A1  Feb. 7, 2019

(51) Int. Cl.
| | | |
|---|---|---|
| *H02H 9/00* | (2006.01) | |
| *H04B 1/40* | (2015.01) | |
| *H02H 9/04* | (2006.01) | |
| *H01F 27/28* | (2006.01) | |
| *G06F 13/40* | (2006.01) | |
| *H04L 25/02* | (2006.01) | |
| *H03K 19/0175* | (2006.01) | |

(52) U.S. Cl.
CPC ........... *H04B 1/40* (2013.01); *G06F 13/4086* (2013.01); *H01F 27/28* (2013.01); *H02H 9/045* (2013.01); *H03K 19/0175* (2013.01); *H04L 25/0266* (2013.01)

(58) Field of Classification Search
None
See application file for complete search history.

(56) References Cited

U.S. PATENT DOCUMENTS

| | | | |
|---|---|---|---|
| 3,956,717 A * | 5/1976 | Fisher ................. | H03H 7/46 |
| | | | 333/121 |
| 7,474,539 B2 * | 1/2009 | Huang ................. | H01L 23/645 |
| | | | 174/250 |
| 9,502,168 B1 | 11/2016 | Ler et al. | |
| 10,382,098 B2 * | 8/2019 | Hueber ............... | H04B 5/0081 |
| 2006/0151851 A1 | 7/2006 | Pillai et al. | |
| 2008/0189455 A1 | 8/2008 | Dreps et al. | |
| 2015/0214943 A1 | 7/2015 | Tirunagari et al. | |
| 2016/0336741 A1 | 11/2016 | Chen et al. | |

FOREIGN PATENT DOCUMENTS

WO  WO 2016/105617 A2  6/2016

OTHER PUBLICATIONS

Galal, Sherif et al; "Broadband ESD Protection circuits in CMOS Technology"; IEEE J. of Solid-State Circuits, vol. 38, No. 12—Brief Papers; 7 pages (Dec. 2003).

Shekhar, Sudip et al; "Bandwidth Extension Techniques for CMOS Amplifiers"; IEEE J. Solid-State Circuits, vol. 41, No. 11; 16 pages (Nov. 2006).

(Continued)

*Primary Examiner* — Stephen W Jackson

(57) ABSTRACT

One example discloses an interface circuit, including: an inductive coil having a first, second and third terminal; wherein the first terminal is coupled to an external interface port; wherein the second terminal is coupled to a first communication port; wherein the third terminal is coupled to a second communication port; and wherein the inductive coil is configured to attenuate an equivalent capacitance from at least one of the terminals.

23 Claims, 4 Drawing Sheets

(56) References Cited

OTHER PUBLICATIONS

Linten, D. et al; "T-Diodes—A Novel Plug-and-Play Wideband RF Circuite ESD Protection Methodology"; 29th Electrical Overstress/Electrostatic Discharge Sysmposium (EOS/ESD); pp. 4A.1-1-4A.1-8 (2007).
Kossel, Marcel et al; "A T-Coil-Enhanced 8.5 Gb/s High-Swing SST Transmitter in 65nm Bulk CMOS with < - 16 dB Return Loss Over 10 GHz Bandwitdth"; IEEE J. of Solid-State Circuits, vol. 43, No. 12; 16 pages (Dec. 2008).

* cited by examiner

INTERFACE CIRCUIT

The present specification relates to systems, methods, apparatuses, devices, articles of manufacture and instructions for circuit interfaces.

SUMMARY

According to an example embodiment, an interface circuit, comprising: an inductive coil having a first, second and third terminal; wherein the first terminal is coupled to an external interface port; wherein the second terminal is coupled to a first communication port; wherein the third terminal is coupled to a second communication port; and wherein the inductive coil is configured to attenuate an equivalent capacitance from at least one of the terminals.

In another example embodiment, the inductive coil is configured to shield the second communication port from a capacitance at the external interface port and a capacitance at the first communication port.

In another example embodiment, the inductive coil is configured to shield the first communication port from a capacitance at the external interface port and a capacitance at the second communication port.

In another example embodiment, the inductive coil is configured to shield the external interface port from capacitances at the first and second communication ports.

In another example embodiment, the third terminal is a center-tap of the inductive coil.

In another example embodiment, the external interface port is a dual-role port.

In another example embodiment, the first communication port is a transmitter input port; and the second communication port is a receiver output port.

In another example embodiment, the first communication port is a receiver output port; and the second communication port is transmitter input port.

In another example embodiment, the first communication port is a first transmitter input port; and the second communication port is a second transmitter input port.

In another example embodiment, the first communication port is a first receiver output port; and the second communication port is a receiver output port.

In another example embodiment, further comprising an ESD protection circuit coupled between the first terminal of the inductive coil and the external interface port.

In another example embodiment, the ESD circuit includes a set of ESD diodes.

In another example embodiment, further comprising an ESD protection circuit; wherein the ESD protection circuit is not coupled between the third terminal of the inductive coil and the second communication port.

In another example embodiment, further comprising an ESD protection circuit; wherein the ESD protection circuit is not coupled between the second terminal of the inductive coil and the first communication port.

In another example embodiment, further comprising an ESD protection circuit coupled either between the second terminal of the inductive coil and the first communications port, or between the third terminal of the inductive coil and the second communications port.

In another example embodiment, the interface circuit is a communications interface circuit.

In another example embodiment, the communications interface circuit is coupled to at least one of: a high-speed circuit, a USB circuit, a DP compliant circuit, a Thunderbolt compliant circuit, or a PCIe circuit.

In another example embodiment, the inductive coil is configured to extend a bandwidth of at least one of the ports.

In another example embodiment, the inductive coil is configured to reduce a return-loss of at least one of the ports.

In another example embodiment, further comprising: a transmitter coupled to the first communication port; and a receiver coupled to the second communication port.

In another example embodiment, further comprising: a discrete connection cable coupled to the external interface port.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings, in which:

Figure 1:
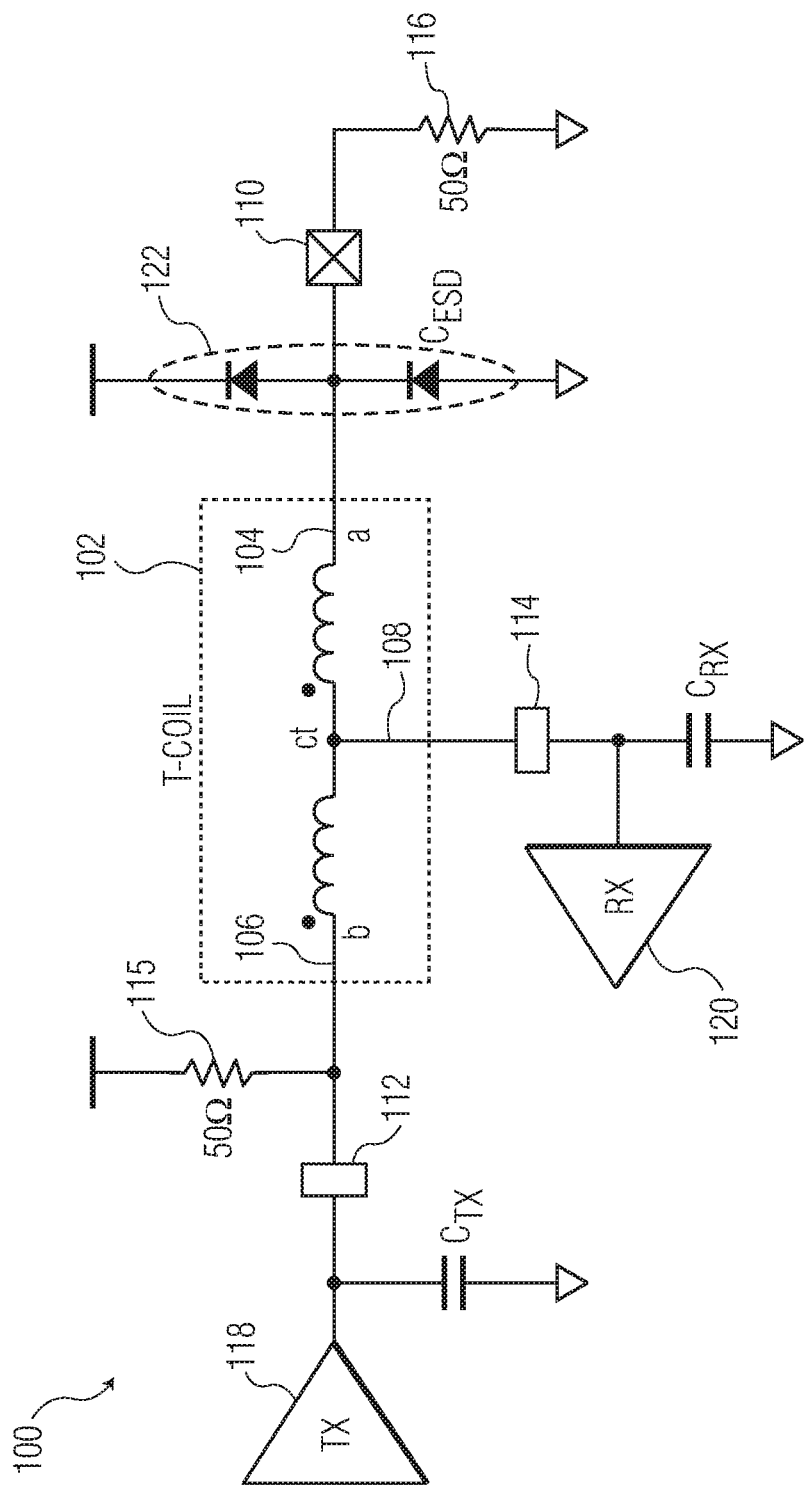
FIG. 1 is a first example of an interface circuit.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Bandwidth, return-loss and ESD (Electro-Static Discharge) protection are competing concerns for high-speed interface circuits and communication pathways. Solutions to one of these three concerns may be optimized, but often at the expense of the other two concerns. Compromise solutions may have a significant increase in capacitive loading seen by various devices and circuits coupled to such interface circuits and communication pathways. Such increased capacitive loading can reduce a bandwidth, degrade a return-loss, and/or reduce ESD protection for such interface circuits and communication pathways.

Now described are various example embodiments of a bandwidth extension technique, which significantly improves a return loss and bandwidth for interface circuits, such as a receiver (RX) and transmitter (TX) interface circuit with a dual-role (e.g. TX/RX) I/O pin, and that meets or exceeds stringent ESD and surge current protection requirements.

FIG. 1 is a first example 100 of an interface circuit. The first interface circuit 100 includes an inductive coil 102 (e.g. T-coil), having a first terminal 104 (e.g. "a"), a second terminal 106 (e.g. "b"), and a third terminal 108 (e.g. "ct", center tap).

The first interface circuit 100 also includes an external interface port 110 (e.g. I/O port, dual-role port), a first communication port 112 (e.g. transmit signal input port), a second communication port 114 (e.g. received signal output port), an internal termination 115, an external termination 116, a transmitter 118 (e.g. TX), a receiver 120 (e.g. RX), and an ESD circuit 122 (e.g. ESD diodes).

In the interface circuit 100, the first terminal 104 (e.g. "a") of the inductive coil 102 (e.g. T-coil) is coupled to the external interface port 110, the second terminal (e.g. "b") is coupled to the first communication port 112, and the third terminal (e.g. "ct") is coupled to the second communication port 114. In this configuration, the inductive coil 102 attenuates an equivalent capacitance (e.g. shields an actual capacitance) from at least one of the terminals 104, 106, 108 as seen by at least one of the other terminals 104, 106, 108.

For example embodiments where, the first communication port 112 is a transmitter input port coupled to the transmitter 118 (e.g. TX) and the internal termination 115, and the second communication port 114 is a receiver output port coupled to the receiver 120 (e.g. RX), then the external interface port 110 is a dual-role port since it provides both a input/output (i.e. transmit/receive) pin for communication with other circuits (not shown).

Figure 3:
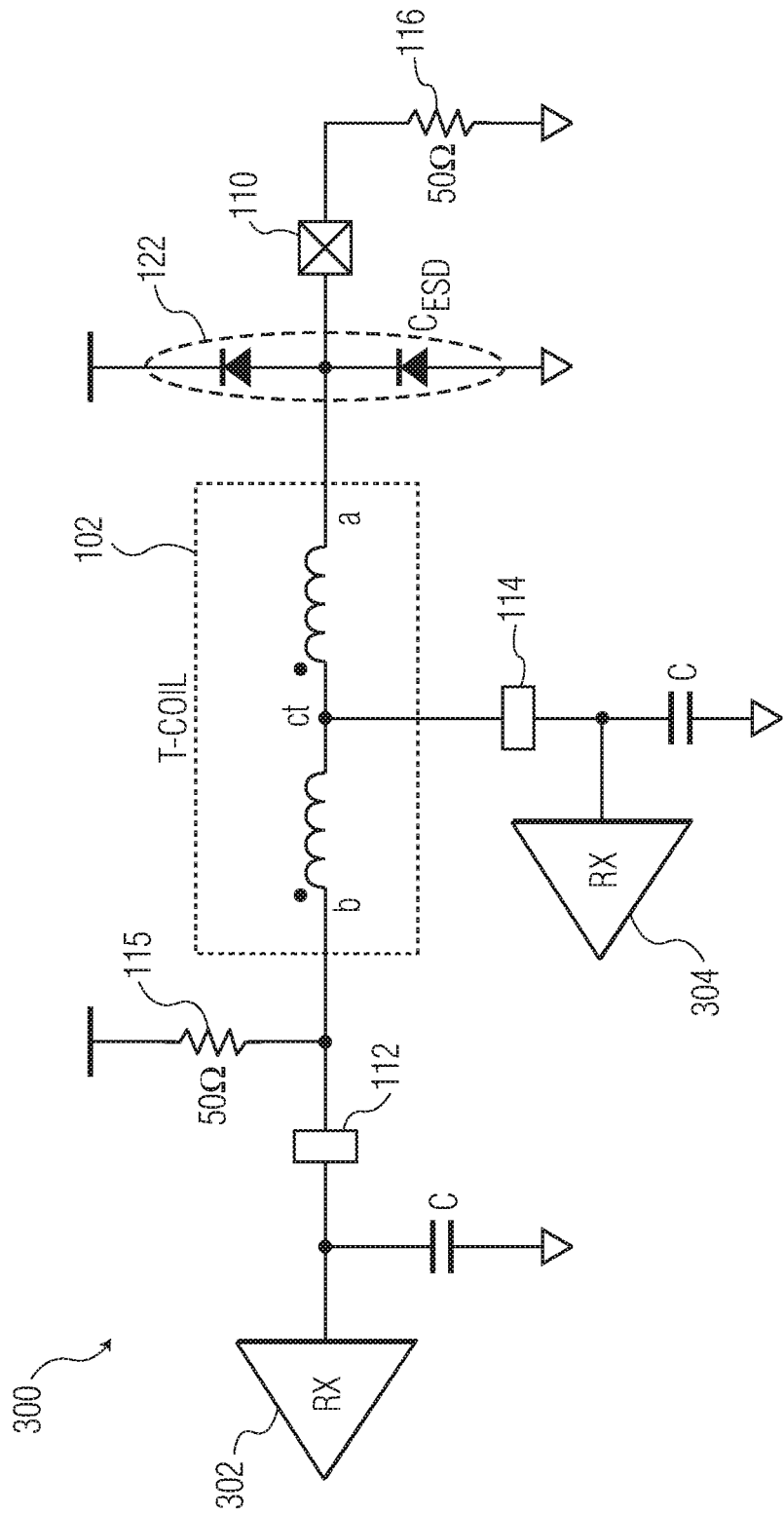
FIG. 3 is a second example of an interface circuit.
Figure 4:
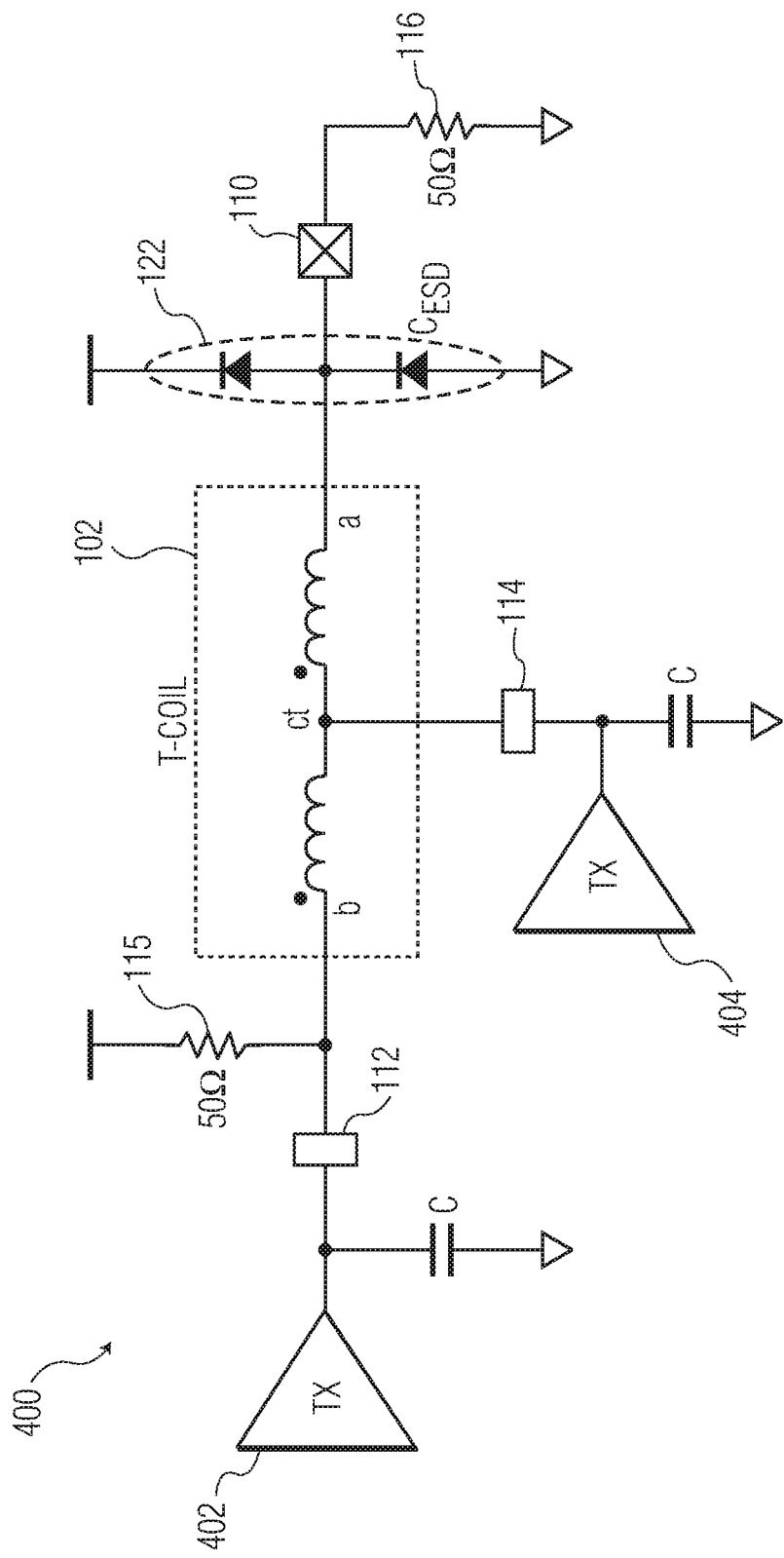
FIG. 4 is a third example of an interface circuit.

In alternative example embodiments, the first communication port 112 could be a receiver output port; and the second communication port 114 could be a transmitter input port. FIGS. 3 and 4.

In the example embodiment of FIG. 1, however, the transmitter 118 drives the first communication port 112 directly, and the second communication port 114 feeds the receiver 120. The inductive coil 102 configures capacitive loads from the receiver 120, the transmitter 118 and the ESD circuit 122 capacitive load to distribute and reduce capacitive loads seen by the receiver 120 and the transmitter 118. This configuration reduces an equivalent capacitive load of the transmitter 118 and the receiver 120.

Using the inductive coil 102, both the transmitter 118 and the receiver 120 are equivalently loaded by a fraction of the discrete and parasitic capacitances from the transmitter 118, the receiver 120, the external interface port 110, and the ESD circuit 122. Thus, a bandwidth of both transmitter 118 and receiver 120 is extended (i.e. widened) and a return loss of the external interface port 110 is improved.

In one example embodiment the interface circuit 100 is a communications interface circuit coupled to a discrete connection cable at the external interface port 110 (e.g. I/O port, dual-role pin). The discrete connection cable is herein defined to include physically separate/standalone cable configured to couple at least one of the following together: circuit boards, computers, routers, storage medium, communications devices, etc.).

Such a communications interface circuit can be coupled to at least one of: a high-speed circuit, a USB circuit, a Display Port (DP) compliant circuit, a Thunderbolt compliant circuit or a PCIe circuit.

In this example embodiments, the ESD circuit 122 is placed at the first terminal 104 (e.g. "a") before the external interface port 110, thereby protecting the inductive coil 102, the transmitter 118 and the receiver 120 from ESD events. In other example embodiments the ESD circuit 122 could be placed either at the second terminal 106 (e.g. "b") and/or third terminal 108 (e.g. "ct"), depending upon design requirements.

However, if the ESD circuit 122 is placed at the third terminal 108 (e.g. "ct"), then a third terminal 108 (e.g. "ct") resistance of the inductive coil 102 could cause additional stress for any circuit connected to the second terminal 106 (e.g. "b") of the inductive coil 102. For example, circuit at port b in an 8 kV HBM test could be stressed more than 1V with a 0.2 Ohm third terminal 108 (e.g. center tap) resistance.

In this example embodiment, the receiver 120 is connected to the second communication port 114 and the third terminal 108 (e.g. "ct", center tap), and the transmitter 118 drives the first communication port 112 and second terminal 106 (e.g. "b") instead of the second communication port 114 and the third terminal 108 (e.g. "ct", center tap) so as to maximum the bandwidth extension (See FIG. 2 analysis below).

In this configuration, the transmitter 118 has a wider bandwidth compared to a design with both the receiver 120 and the transmitter 118 connected to the second terminal 106 (e.g. "b") or terminal 108 (e.g. "ct"), since in this configuration the transmitter 118 needs to drive only its self-load capacitance and the internal termination 115 (e.g. 50 Ohm) between the first communication port 112 and the second terminal 106 (e.g. "b") as shown in FIG. 1).

The receiver 120, on the other hand, still benefits from the transmitter 118 capacitance and the ESD circuit 122 capacitance being distributed rather than lumped at the third terminal 108 (e.g. "ct", center tap).

The inductive coil 102 (e.g. T-coil) is sized to cancel the capacitance from the receiver 120 as seen by the transmitter 118. In this example embodiments, the inductive coil 102 does not need to pass any ESD or surge currents. As a result, this inductive coil 102 (e.g. T-coil) design is flexible and can achieve a desired performance in an area-efficient way.

Return loss of the external interface port 110 is significantly improved compared to a design with the transmitter 118 and receiver 120 connected to the external interface port 110 directly. While a return loss of the first interface circuit 100 may be greater than a design with the receiver 120, transmitter 118 and the ESD circuit 122 connected at the third terminal 108 (e.g. "ct", center tap).

The first interface circuit 100 also extends the bandwidth of receiver 120 and transmitter 118 more than a design with the receiver 120, transmitter 118 and the ESD circuit 122 connected at the third terminal 108 (e.g. "ct", center tap).

Designs with the receiver 120, transmitter 118 and ESD circuit 122 connected at the third terminal 108 (e.g. "ct", center tap) may have a reduced bandwidth compared to a receiver or transmitter single role design due to the limited bandwidth extension effect that is outweighed by the extra parasitic capacitances from a larger inductive coil 102 (e.g. T-coil) and larger lumped capacitance from receiver, transmitter and ESD circuit.

Figure 2:
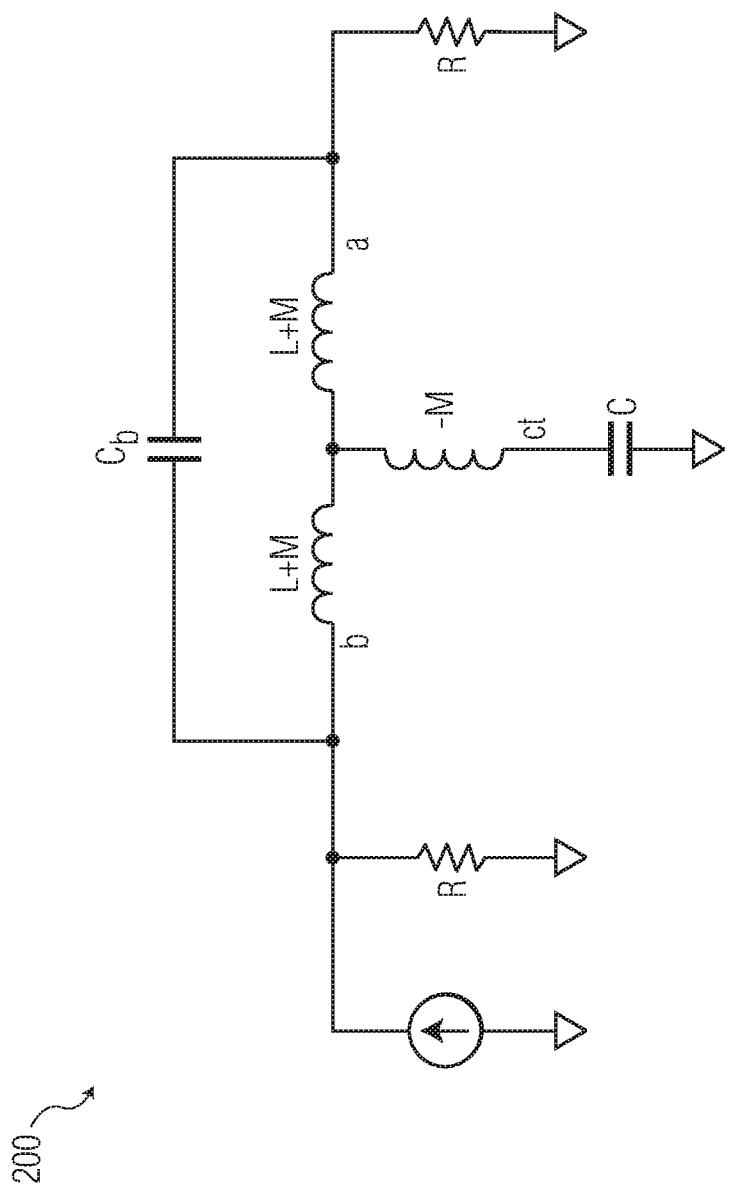
FIG. 2 is an electrical equivalent of the first example interface circuit.

FIG. 2 is an electrical equivalent 200 of the first example 100 interface circuit without $C_{ESD}$ and $C_{TX}$. As a further discussion of the bandwidth extension and return loss reduction principles of the first interface circuit 100, the idealized electrical equivalent 200 of the first example 100 interface circuit is mathematically represented by the equations that follow.

If:

$$\frac{2}{C(L-M)} = \frac{1}{(L+M)2C_b} = \omega_0^2 \text{ and } \frac{R}{L-M} = \frac{1}{R \cdot 2C_b} = \frac{\omega_0}{Q} \ldots$$

then the transfer impedance from the second terminal 106 (e.g. "b") to the first terminal 104 (e.g. "a") is:

$$Z_{ba} = \frac{1}{2} \frac{-\frac{s}{2C_b} + R\left(s^2 + \frac{2}{C(L-M)}\right)}{s^2 + s\frac{\omega_0}{Q} + \omega_0^2} = \frac{1}{2} R \frac{s^2 - s\frac{\omega_0}{Q} + \omega_0^2}{s^2 + s\frac{\omega_0}{Q} + \omega_0^2}$$

Transfer impedance from the first terminal 104 (e.g. "a") or the second terminal 106 (e.g. "b") to the third terminal 108 (e.g. "ct", center tap) is:

$$Z_{bct} = \frac{1}{2} R \frac{\omega_0^2}{s^2 + s\frac{\omega_0}{Q} + \omega_0^2}$$

From the equations above, a bandwidth of the transmitter 118 will be infinite without self-load capacitance and the ESD circuit 122 load capacitance. When these capacitances present, the bandwidth of the transmitter 118 will be dominated by either the self-load capacitance or the ESD circuit 122 capacitance rather than the total of the two capacitances.

As shown by the equation for $Z_{bct}$, the receiver 120 bandwidth has an additional limiting factor. However, the first interface circuit 100 has a greater bandwidth and a better return-loss than a single receiver role design without the inductive coil 102 since the second order factor in the equation for $Z_{bct}$ could be optimized to be more than one.

FIG. 3 is a second example 300 of an interface circuit. The second interface circuit 300 is substantially similar to the first interface circuit 100, except a first receiver 302 is coupled to the first communication port 112 and a second receiver 304 is coupled to the second communication port 114.

In this example, the external interface port 110 still functions as a dual-role pin since different signals (i.e. frequencies, voltages, currents, etc.) can be processed by either the first receiver 302 or the second receiver 304. In some example embodiments, the second communications port 114 is coupled to the receiver 302, 304 having a lower speed requirement.

FIG. 4 is a third example 400 of an interface circuit. The third interface circuit 400 is substantially similar to the first interface circuit 100, except a first transmitter 402 is coupled to the first communication port 112 and a second transmitter 404 is coupled to the second communication port 114.

In this example, the external interface port 110 still functions as a dual-role pin since different signals (i.e. frequencies, voltages, currents, etc.) can be transmitted by either the first transmitter 402 or the second transmitter 404. In some example embodiments, the second communications port 114 is coupled to the transmitter 402, 404 having a lower speed requirement.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. An interface circuit, comprising:
   an inductive coil having a first, second and third terminal;
   wherein the first terminal is coupled to an external interface port;
   wherein the second terminal is coupled to a first communication port;
   wherein the third terminal is coupled to a second communication port; and
   wherein the inductive coil is configured to attenuate an equivalent capacitance from at least one of the terminals.

2. The circuit of claim 1:
   wherein the inductive coil is configured to shield the second communication port from a capacitance at the external interface port and a capacitance at the first communication port.

3. The circuit of claim 1:
   wherein the inductive coil is configured to shield the first communication port from a capacitance at the external interface port and a capacitance at the second communication port.

4. The circuit of claim 1:
   wherein the inductive coil is configured to shield the external interface port from capacitances at the first and second communication ports.

5. The circuit of claim 1:
   wherein the third terminal is a center-tap of the inductive coil.

6. The circuit of claim 1:
   wherein the external interface port is a dual-role port.

7. The circuit of claim 6:
   wherein the first communication port is a transmitter input port; and
   wherein the second communication port is a receiver output port.

8. The circuit of claim 6:
   wherein the first communication port is a receiver output port; and wherein the second communication port is transmitter input port.

9. The circuit of claim 6:
wherein the first communication port is a first transmitter input port; and
wherein the second communication port is a second transmitter input port.

10. The circuit of claim 6:
wherein the first communication port is a first receiver output port; and
wherein the second communication port is a receiver output port.

11. The circuit of claim 1:
further comprising an ESD protection circuit coupled between the first terminal of the inductive coil and the external interface port.

12. The circuit of claim 11:
wherein the ESD circuit includes a set of ESD diodes.

13. The circuit of claim 1:
further comprising an ESD protection circuit;
wherein the ESD protection circuit is not coupled between the third terminal of the inductive coil and the second communication port.

14. The circuit of claim 1:
further comprising an ESD protection circuit;
wherein the ESD protection circuit is not coupled between the second terminal of the inductive coil and the first communication port.

15. The circuit of claim 1:
further comprising an ESD protection circuit coupled either between the second terminal of the inductive coil and the first communications port, or between the third terminal of the inductive coil and the second communications port.

16. The circuit of claim 1:
wherein the interface circuit is a communications interface circuit.

17. The circuit of claim 16:
wherein the communications interface circuit is coupled to at least one of: a high-speed circuit, a USB circuit, a DP compliant circuit, a Thunderbolt compliant circuit, or a PCIe circuit.

18. The circuit of claim 1:
wherein the inductive coil is configured to extend a bandwidth of at least one of the ports.

19. The circuit of claim 1:
wherein the inductive coil is configured to reduce a return-loss of at least one of the ports.

20. The circuit of claim 1, further comprising:
a transmitter coupled to the first communication port; and
a receiver coupled to the second communication port.

21. The circuit of claim 1, further comprising:
a discrete connection cable coupled to the external interface port.

22. An interface circuit, comprising:
an inductive coil having a first, second and third terminal;
wherein the first terminal is coupled to an external interface port;
wherein the second terminal is coupled to a first communication port;
wherein the third terminal is coupled to a second communication port;
wherein the inductive coil is configured to attenuate an equivalent capacitance from at least one of the terminals; and
wherein the inductive coil is configured to extend a bandwidth of at least one of the ports.

23. An interface circuit, comprising:
an inductive coil having a first, second and third terminal;
wherein the first terminal is coupled to an external interface port;
wherein the second terminal is coupled to a first communication port;
wherein the third terminal is coupled to a second communication port;
wherein the inductive coil is configured to attenuate an equivalent capacitance from at least one of the terminals; and
wherein the inductive coil is configured to reduce a return-loss of at least one of the ports.

* * * * *